United States Patent
Liao et al.

(10) Patent No.: US 12,176,829 B2
(45) Date of Patent: *Dec. 24, 2024

(54) MICROMECHANICAL ARM ARRAY IN MICRO-ELECTROMECHANICAL SYSTEM (MEMS) ACTUATORS

(71) Applicant: Taiwan Semiconductor Manufacturing Company, Ltd., Hsinchu (TW)

(72) Inventors: Shih-Yu Liao, Hsinchu (TW); Tsai-Hao Hung, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/365,204

(22) Filed: Aug. 3, 2023

(65) Prior Publication Data

US 2023/0396189 A1 Dec. 7, 2023

Related U.S. Application Data

(63) Continuation of application No. 17/833,827, filed on Jun. 6, 2022, now Pat. No. 11,757,378.

(51) Int. Cl.
*H02N 1/00* (2006.01)
*B81B 5/00* (2006.01)
(Continued)

(52) U.S. Cl.
CPC ............ *H02N 1/006* (2013.01); *B81B 7/0016* (2013.01); *B81B 2203/0136* (2013.01); *H04N 23/687* (2023.01)

(58) Field of Classification Search
CPC ...... B81B 7/0016; B81B 3/007; H02N 1/006; H02N 1/008; H02N 1/002; H04N 23/68
(Continued)

(56) References Cited

U.S. PATENT DOCUMENTS 6,133,670 A * 10/2000 Rodgers ................. H02N 1/008
310/40 MM
7,444,873 B2 11/2008 Robert
(Continued)

FOREIGN PATENT DOCUMENTS

CN 101536169 B 1/2013
CN 106536403 A 3/2017
(Continued)

OTHER PUBLICATIONS

First office action received in the counterpart Taiwan application 112120819, mailed on Apr. 2, 2024.

*Primary Examiner* — Burton S Mullins
(74) *Attorney, Agent, or Firm* — Kilpatrick Townsend & Stockton LLP

(57) ABSTRACT

A micromechanical arm array is provided. The micromechanical arm array comprises: a plurality of micromechanical arms spaced from each other in a first horizontal direction and extending in a second horizontal direction, wherein each micromechanical arm comprises a protrusion at a top of each micromechanical arm and protruding upwardly in a vertical direction; a plurality of protection films, each protection film encapsulating one of the plurality of micromechanical arms; and a metal connection structure extending in the first horizontal direction. The metal connection structure comprises: a plurality of joint portions, each joint portion corresponding to and surrounding the protrusion of one of the plurality of micromechanical arms; and a plurality of connection portions extending in the first horizontal direction and connecting two neighboring joint portions.

20 Claims, 15 Drawing Sheets

(51) Int. Cl.
*B81B 7/00* (2006.01)
*H04N 23/68* (2023.01)

(58) Field of Classification Search
USPC .......................................................... 310/309
See application file for complete search history.

(56) References Cited

U.S. PATENT DOCUMENTS

| | | | |
|---|---|---|---|
| 7,973,373 B2 * | 7/2011 | Mori | ................... B81B 7/0029 |
| | | | 216/2 |
| 8,138,007 B2 | 3/2012 | Geisberger | |
| 9,036,230 B1 | 5/2015 | Lin | |
| 10,962,424 B2 | 3/2021 | Hung et al. | |

FOREIGN PATENT DOCUMENTS

| | | |
|---|---|---|
| DE | 19928291 A1 | 12/1999 |
| WO | 2019/077063 A1 | 4/2019 |

\* cited by examiner

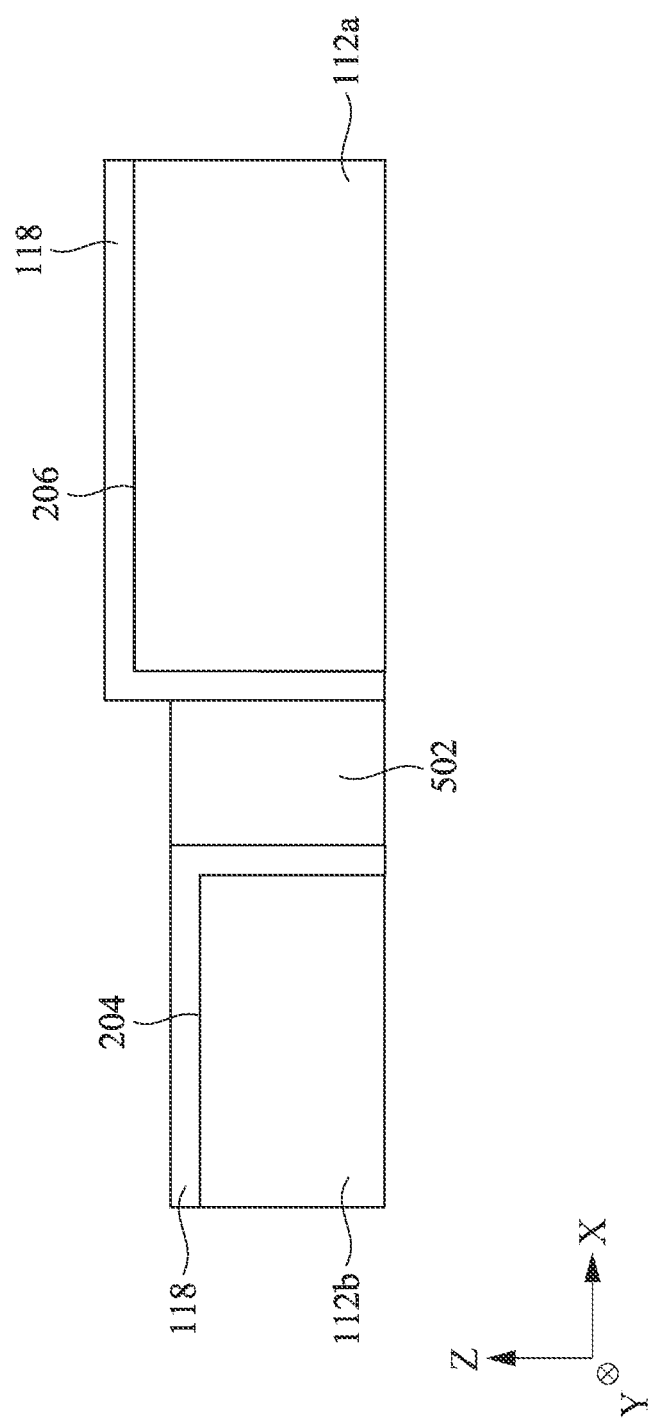

MICROMECHANICAL ARM ARRAY IN MICRO-ELECTROMECHANICAL SYSTEM (MEMS) ACTUATORS

CROSS-REFERENCES TO RELATED APPLICATIONS

The present application is a continuation application of U.S. patent application Ser. No. 17/833,827, filed Jun. 6, 2022 and entitled "MICROMECHANICAL ARM ARRAY IN MICRO-ELECTROMECHANICAL SYSTEM (MEMS) ACTUATORS," the entire disclosure of which is incorporated herein by reference.

FIELD

Embodiments of the present disclosure relate generally to micro-electromechanical systems (MEMS) or nano-electromechnical systems (NEMS) devices, and more particularly to micromechanical arm array used in MEMS actuators.

BACKGROUND

Micro-electromechanical systems ("MEMS") are becoming increasingly popular, particularly as such devices are miniaturized and are integrated into integrated circuit manufacturing processes. MEMS are typically made up of components between 1 and 100 micrometers in size, and MEMS devices generally range in size from 20 micrometers to a millimeter. MEMS merge at the nanoscale into nano-electromechnical systems (NEMS) and nanotechnology.

MEMS devices include mechanical and electrical features formed by one or more semiconductor manufacturing processes. Examples of MEMS devices include micro-sensors, which convert mechanical signals into electrical signals; micro-actuators, which convert electrical signals into mechanical signals; and motion sensors, which are commonly found in automobiles (e.g., in airbag deployment systems) and smartphones. For many applications, MEMS devices are electrically connected to application-specific integrated circuits (ASICs), and to external circuitry to form complete MEMS systems. However, if a MEMS device breaks, for example, due to some impact when being used, it is difficult, if not infeasible, to repair or replace the broken MEMS device. Therefore, there is a need to fabricate reliable and impact-resistant MEMS devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A-5G are cross-sectional views of a portion of the MEMS actuator at various stages of fabrication in accordance with some embodiments.

DETAILED DESCRIPTION OF THE INVENTION

Figure 1:
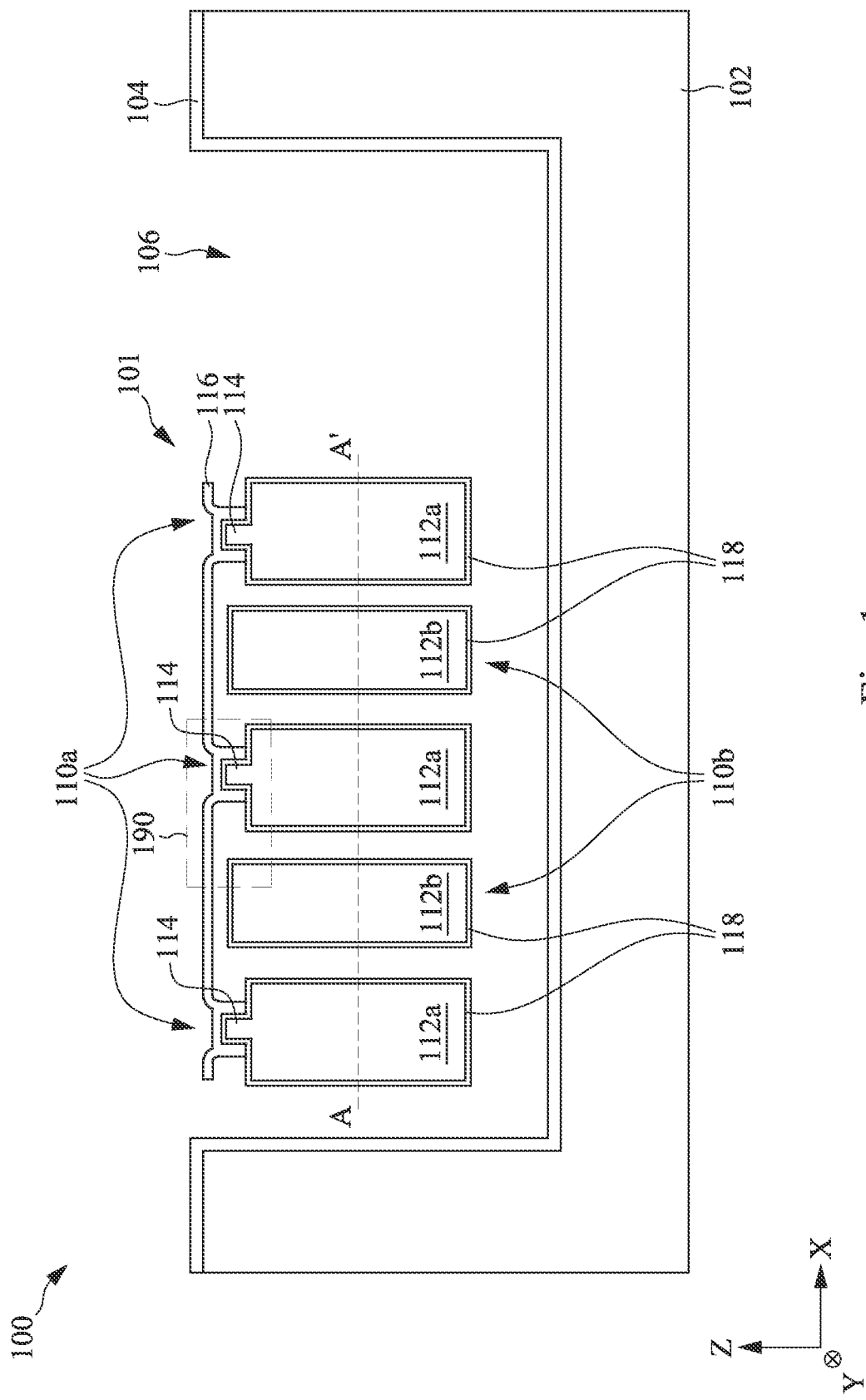
FIG. 1 is a cross-sectional diagram illustrating a MEMS system including micromechanical arm arrays in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Some of the features described below can be replaced or eliminated and additional features can be added for different embodiments. Although some embodiments are discussed with operations performed in a particular order, these operations may be performed in another logical order.

Optical image stabilization (OIS) is a family of techniques that reduce blurring associated with the motion of a camera or other imaging devices during exposure. Image stabilization is typically used in high-end image-stabilized binoculars, still and video cameras, astronomical telescopes, and high-end smartphones. Lens-based OIS works by moving the lens to compensate for the change in the optical path. Sensor-shift OIS, on the other hand, works by moving the image sensor instead of the lens to compensate for the change in the optical path.

The advantage of moving the image sensor, instead of the lens, is that the image can be stabilized even on lenses made without stabilization. This may allow the stabilization to work with many otherwise-unstabilized lenses. It also reduces the weight and complexity of the lenses. Further, when sensor-shift OIS technology improves, it requires replacing only the camera to take advantage of the improvements, which is typically far less expensive than replacing all existing lenses if relying on lens-based image stabilization.

In some implementations, sensor-shift IOS is based on a MEMS actuator which can move in, for example, five axes (i.e., X, Y, Roll, Yaw, and Pitch). An image sensor is attached to the MEMS actuator and thus can move in five axes accordingly.

In some implementations, a MEMS actuator includes at least one micromechanical arm array. Each micromechanical arm array includes multiple micromechanical arms. Each micromechanical arm is typically an elongated structure fabricated using semiconductor processes.

However, the impact on the MEMS actuator can render the micromechanical arms inside MEMS actuators broken. For instance, a smartphone that has MEMS actuators accidentally falls on the ground, and the impact could result in a fractured touchscreen and broken micromechanical arms in the MEMS actuators inside the smartphone. While it is feasible to replace the touchscreen, it is impractical, if not impossible, to replace the broken micromechanical arms, given that the critical dimensions of the broken micromechanical arms are at the microscale or even the nanoscale. As a result, the functioning of the sensor-shift OIS may be significantly compromised. Thus, the robustness and impact resistance of micromechanical arms are desirable. In addition, it is desirable to have MEMS actuators with high sensitivity and conductivity.

In accordance with some aspects of the disclosure, a micromechanical arm array and a MEMS actuator based thereon are provided. The micromechanical arm array includes a number of micromechanical arms spaced from each other in a first horizontal direction and extending in a second horizontal direction. Each micromechanical arm has a protrusion at its top, and the protrusion protrudes upwardly in a vertical direction. Protection films encapsulate the micromechanical arms, thus preventing etchants from etching them in a subsequent silicon release process. A metal connection structure extends in the first horizontal direction and includes a number of joint portions and a number of connection portions connecting the joint portions. Each join portion corresponds to and surrounds the protrusion of each micromechanical arm.

Because the two corners of the original micromechanical arms are etched to form the protrusions, additional spaces are created to accommodate the movement of a second set of micromechanical arms. The additional spaces can prevent unintended impact between the micromechanical arms, thus making the MEMS actuator based thereon more impact-resistant and reliable.

In addition, compared with a micromechanical arm having a flat top surface without a protrusion, the presence of the protrusion increases the contact area between the metal connection structure and the micromechanical arm (with a protection film therebetween). The increased contact area results in a better conductivity of the micromechanical arm. The better conductivity of the micromechanical arm in turn results in a better sensitivity of the MEMS actuator because a smaller electrical signal (e.g., voltage signal) is needed for the same displacement of the MEMS actuator.

Figure 2:
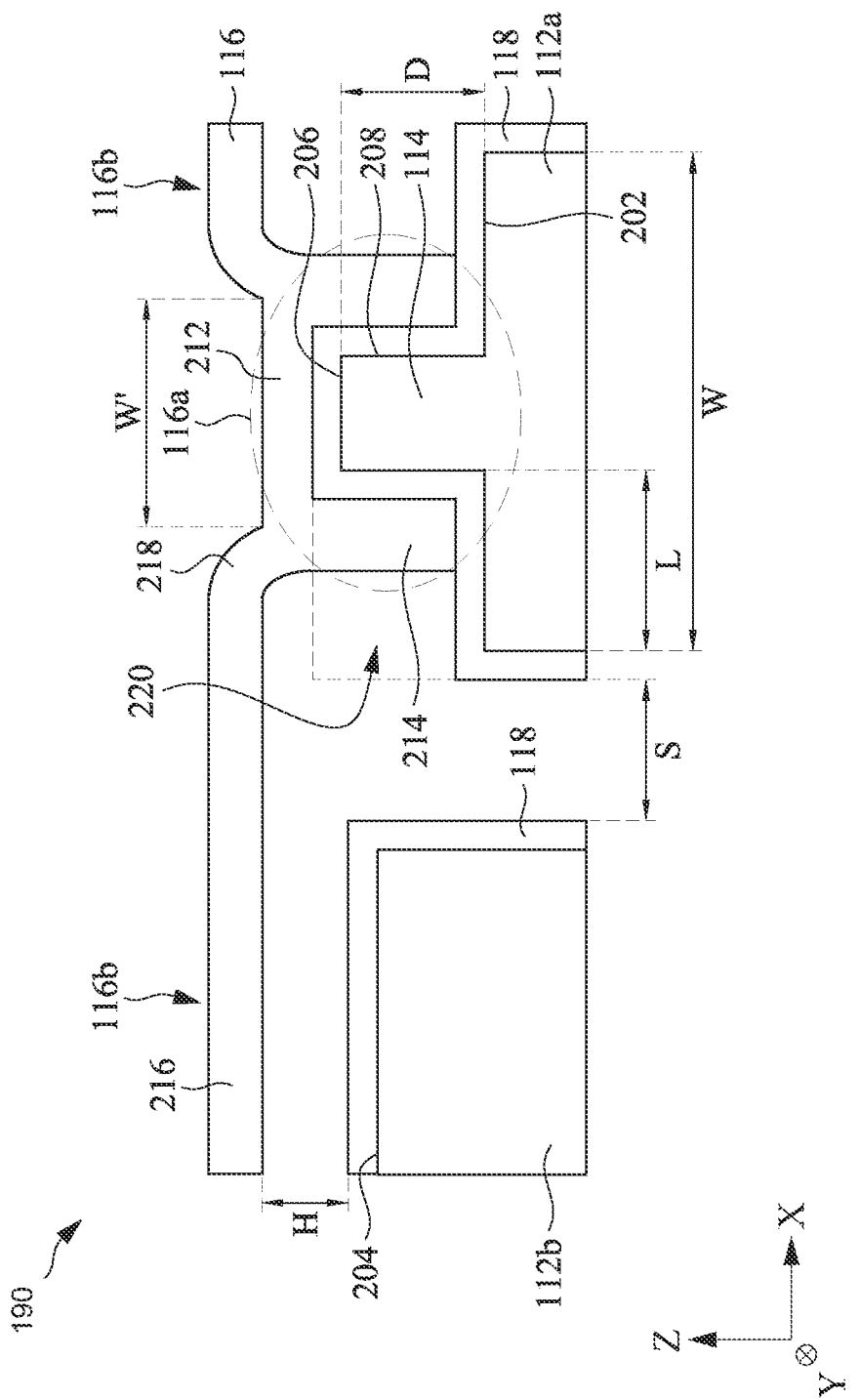
FIG. 2 is a diagram illustrating the region 190 shown in FIG. 1 in accordance with some embodiments.
Figure 3:
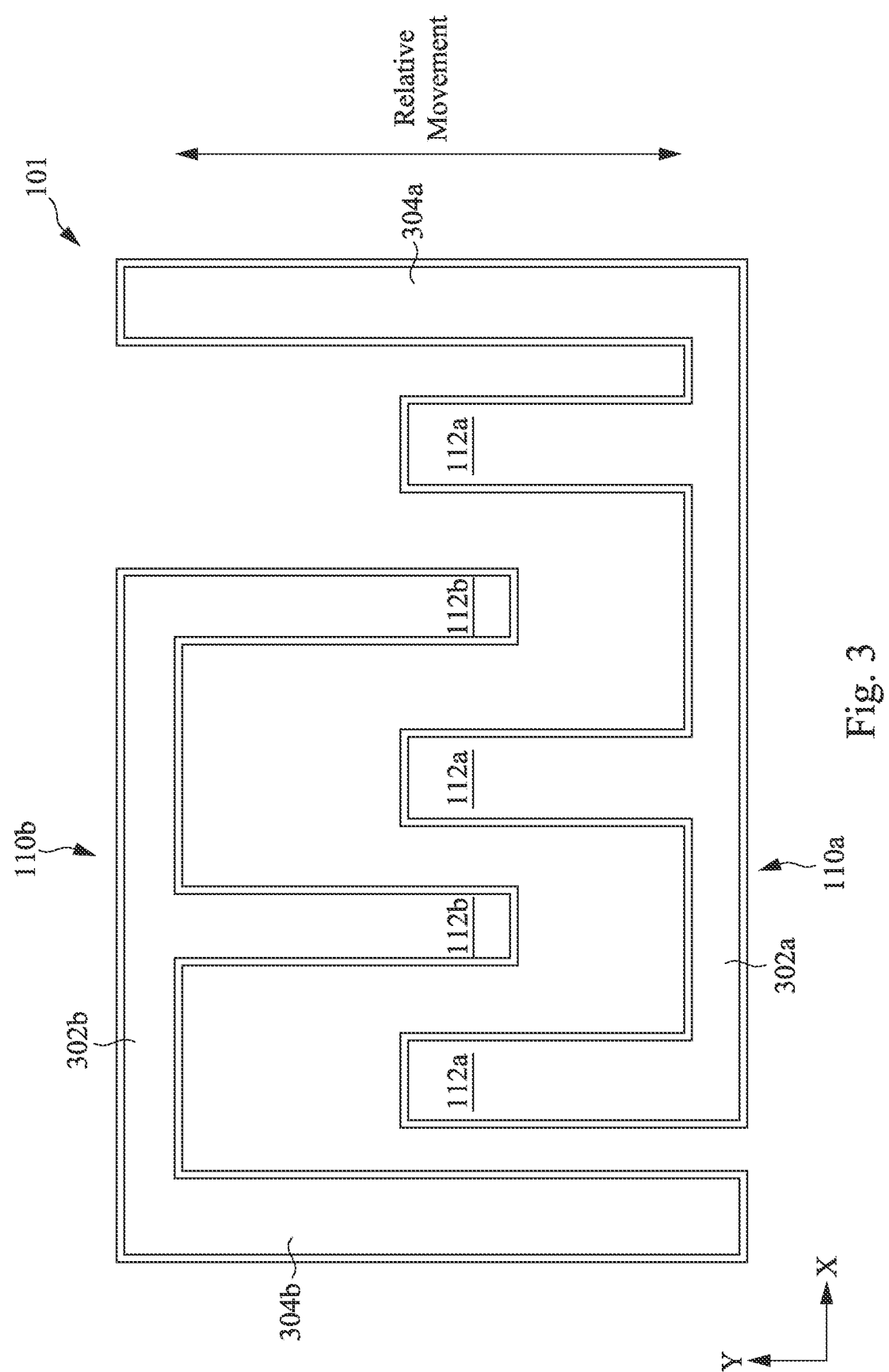
FIG. 3 is a diagram illustrating a cross-section taken at A-A' shown in FIG. 1 in accordance with some embodiment.

FIG. 1 is a cross-sectional diagram illustrating a MEMS system 100 including micromechanical arm arrays 110a and 110b in accordance with some embodiments. FIG. 2 is a diagram illustrating the region 190 shown in FIG. 1 in accordance with some embodiments. FIG. 3 is a diagram illustrating a cross-section taken at A-A' shown in FIG. 1 in accordance with some embodiment. It should be understood that FIGS. 1-3 are not drawn to scale.

In the example shown in FIG. 1, the MEMS system 100 includes, among other components, a substrate 102 having a cavity 106, an etch stop layer 104 deposited on the substrate 102, a first micromechanical arm array 110a, and a second micromechanical arm array 110b. The first micromechanical arm array 110a and the second micromechanical arm array 110b form a MEMS actuator 101.

In one implementation, the substrate 102 is a silicon substrate, and the etch stop layer 104 is made of silicon dioxide. In one implementation, the etch stop layer 104 is deposited in a trench formed in the substrate 102 and covers the bottom and sidewalls of the trench. As will be explained below with reference to FIGS. 4-5G, the etch stop layer 104 prevents etchants from etching the substrate 102 during a silicon release process (sometimes also referred to as a "sacrificial release process"), in which a silicon sacrificial region is removed, and the cavity 106 is formed. Because of the silicon release process, there is a gap between the etch stop layer 104 and MEMS actuator 101 in the horizontal direction (i.e., the Z-direction shown in FIG. 1).

The first micromechanical arm array 110a includes, among other components, multiple micromechanical arms 112a, protection films 118 covering each micromechanical arm 112a, and a metal connection structure 116 connecting the micromechanical arms 112a. The micromechanical arms 112a are spaced from each other in a first horizontal direction (i.e., the X-direction shown in FIG. 1). The micromechanical arms 112a are elongated and extend in parallel in a second horizontal direction (i.e., the Y-direction). In one implementation, each micromechanical arm 112a has a free end and a fixed end. There is a gap between the etch stop layer 104 and the micromechanical arms 112a in the Z-direction. In other words, the micromechanical arms 112a are suspended in the cavity 106. As a result, the free end of each micromechanical arm 112a can move freely due to the suspension of the micromechanical arm 112a in the cavity 106.

Each micromechanical arm 112a includes a protrusion 114 at its top. The protrusion 114 protrudes upwardly in the Z-direction. In one embodiment, the protrusion 114 is a fin at the top of each micromechanical arm 112a and extends in the Y-direction. Details of the protrusion 114 will be described below with reference to FIG. 2. The fabrication of the protrusion 114 will be described below with reference to FIGS. 4-5G.

Each micromechanical arm 112a is covered by the protection film 118. The protection film 118 serves as an etch stop film that prevents etchants from etching the corresponding micromechanical arm 112a during the silicon release process.

The metal connection structure 116 extends in the X-direction and connects neighboring micromechanical arms 112a. The metal connection structure 116 is attached to the micromechanical arms 112a at the protrusions 114, with the protection films 118 therebetween. Details of the metal connection structure 116 will be described below with reference to FIG. 2. The fabrication of the metal connection structure 116 will be described below with reference to FIGS. 4-5G.

In one implementation, the micromechanical arms 112a are made of polycrystalline silicon ("poly"), the protection films 118 are made of silicon dioxide ($SiO_2$), and the metal connection structure 116 is made of metal such as aluminum copper alloy (AlCu). It should be understood that other combinations of materials can be employed in other implementations. For example, the micromechanical arms 112a are made of single crystal silicon or amorphous silicon. For example, the protection films 118 are made of silicon nitride ($Si_3N_4$), silicon carbide (SiC), undoped silicon glass (USG), fluorosilicate glass (FSG), borophosphosilicate glass (BPSG). For example, the metal connection structure 116 may be made of titanium nitride (TiN), tantalum nitride (TaN), Al—Si—Cu alloy, copper (Cu), or other suitable materials.

Likewise, the second micromechanical arm array 110b includes, among other components, multiple micromechanical arms 112b and protection films 118 covering each micromechanical arm 112b. In some embodiments, the second micromechanical arm array 110b also includes a metal connection structure (like the metal connection structure 116 shown in FIG. 1) connecting the micromechanical arms 112b, and the metal connection structure is not shown in the cross-section shown in FIG. 1. The micromechanical arms 112b are spaced from each other in the X-direction. The micromechanical arms 112b are elongated and extend in parallel in the Y-direction. In one implementation, each micromechanical arm 112b has a free end and a fixed end. There is a gap between the etch stop layer 104 and the micromechanical arms 112b in the Z-direction. In other words, the micromechanical arms 112b are suspended in the cavity 106. As a result, the free end of each micromechanical arm 112b can move freely due to the suspension of the micromechanical arm 112b in the cavity 106.

It should be understood that although three micromechanical arms 112a and two micromechanical arms 112b are illustrated in FIG. 1, it is not intended to be limiting. In other embodiments, the first micromechanical arm array 110a may include another number (e.g., eight) of micromechanical arms 112a, while the second micromechanical arm array 10b may include another number (e.g., seven) of micromechanical arms 112b. One of ordinary skill in the art would recognize many variations, modifications, and alternatives.

The micromechanical arms 112a and the micromechanical arms 112b are interposed in the X-direction. In the example shown in FIG. 1, each micromechanical arm 112b is located, in the X-direction, between two neighboring micromechanical arms 112a.

Unlike the micromechanical arms 112a, each of micromechanical arms 112b has a flat top surface instead of a protrusion. There is a gap in the Z-direction between the top surface of each micromechanical arm 112b and the metal connection structure 116.

Likewise, each micromechanical arm 112b is covered by the protection film 118. The protection film 118 serves as an etch stop film that prevents etchants from etching the corresponding micromechanical arm 112a during the silicon release process.

As mentioned above, in some embodiments, the second micromechanical arm array 110b includes its own metal connection structure, which extends in the X-direction and connects neighboring micromechanical arms 112b. The metal connection structure is attached to the micromechanical arms 112b, with the protection films 118 therebetween.

In one implementation, the micromechanical arms 112b are made of poly, and the protection films 118 are made of silicon. It should be understood that other combinations of materials can be employed in other implementations.

Referring to FIG. 2, which illustrates the region 190 shown in FIG. 1 in greater detail, the protrusion 114 has a top surface 206 and two sidewalls 208. As will be explained below, the protrusion 114 is formed by patterning and etching a portion of the top portion of the micromechanical arm 112a. As shown in FIG. 2, two corners of the original micromechanical arm 112, at both sides of the protrusion 114 in the X-direction, are etched. That is, two shoulders 202 are formed at both sides of the protrusion 114 in the X-direction. The depth of the etched portion in the Z-direction is D, while the width of the etched portion in the X-direction is L.

Because the two corners of the original micromechanical arm 112 are etched, the additional space 220 is created to accommodate the movement of the micromechanical arm 112b relative to the micromechanical arm 112a. The additional space 220 can prevent unintended impact between the micromechanical arms 112a and 112b, thus making the MEMS actuator 101 more impact-resistant and reliable.

In the example shown in FIG. 2, the metal connection structure 116 includes a joint portion 116a and a connection portion 116b. The joint portion 116a is located on the top of the micromechanical arm 112a and attached to the micromechanical arm 112a, with the protection film 118 therebetween. In other words, the joint portion 116a and the protrusion 114 sandwich the protection film 118. In the example shown in FIG. 2, the joint portion 116a includes a top portion 212 and two sidewall portions 214. The top portion 212 is located on the top surface 206 of the protrusion 114, with the protection film 118 therebetween. The sidewall portions 214 are located at the sidewalls of the protrusion 114, with the protection film 118 therebetween.

Compared with a micromechanical arm having a flat top surface without a protrusion, the presence of the protrusion 114 increases the contact area between the metal connection structure 116 and the micromechanical arm 112a (with the protection film 118 therebetween). The increased contact area results in a better conductivity of the micromechanical arm 112a. The better conductivity of the micromechanical arm 112a in turn results in a better sensitivity of the MEMS actuator 101 because a smaller electrical signal (e.g., voltage signal) is needed for the same displacement of the MEMS actuator 101. In one example, the conductivity of the micromechanical arm 112 is increased by 100%, while the sensitivity of the MEMS actuator 101 is increased by 35%.

The connection portion 116b extends in the X-direction and connects two neighboring joint portions 116a. In the example shown in FIG. 2, the connection portion 116b includes a planar portion 216 extending in the X-direction and two round corner portions 218 at both ends of the planar portion 216 in the X-direction.

As shown in FIG. 2, the space between the micromechanical arms 112a and 112b (including the protection films 118) in the X-direction is S, the width of the micromechanical arm 112a in the X-direction is W, the distance between the top surface of the protection film 118 on the top surface 204 of the micromechanical arm 112b and the bottom surface of the planar portion 216 of the connection portion 116b in the Z-direction is H, and the width of the top portion 212 of the joint portion 116a in the X-direction is W'.

In one embodiment, D is larger than 1.3 μm, while L is equal to or larger than 1 μm. In one example, D is 1.5 μm, while L is 1 μm. In another example, D is 2 μm, while L is 1.5 μm. In one embodiment, W' is 2.6 μm, H is 1.6 μm, the thickness of the protection film 118 is 0.2 μm, and the thickness of the metal connection structure 116 in the Z-direction is 0.8 μm.

In one embodiment, S is equal to or larger than one-third of W. In one example, S is equal to one-third of W. In another example, S is equal to half of W. In one embodiment, H is larger than D. In one embodiment, D is equal to or larger than one-tenth of W'. In another embodiment, D is equal to or larger than one-fifth of W'. In one embodiment, the width of the sidewall portion 214 in the X-direction is equal to or larger than one-fifth of W'.

Referring to FIG. 3, the MEMS actuator 101 includes the first micromechanical arm array 110a and the second micromechanical arm array 110b. The first micromechanical arm array 110a includes the micromechanical arms 112a extending in the Y-direction, a spine beam 302a extending in the X-direction, and a main beam 304a extending in the Y-direction. Likewise, the second micromechanical arm array 110b includes the micromechanical arms 112b extending in the Y-direction, a spine beam 302b, and a main beam 304b extending in the Y-direction.

Each micromechanical arm 112a has a free end and a fixed end, which is attached to the spine beam 302a. The spine beam 302a connects the multiple micromechanical arms 112a together. Similarly, each micromechanical arm 112b has a free end and a fixed end, which is attached to the spine beam 302b. The spine beam 302b connects the multiple micromechanical arms 112b together.

As mentioned above, the micromechanical arms 112a and the micromechanical arms 112b are interposed in the X-direction. When a voltage or electrical potential tension is applied between the neighboring micromechanical arms 112a and 112b, the first micromechanical arm array 110a and the second micromechanical arm array 110b are attracted to each other due to an electrostatic force. In one example, the electrostatic force is proportional to the square of the applied voltage. On the other hand, a restoring force that separates the first micromechanical arm array 110a and the second micromechanical arm array 110b may be used to balance the electrostatic force. In one implementation, the restoring force is provided by a spring structure. As a result, a relative movement (shown by the arrow in FIG. 3) in the Y-direction between the first micromechanical arm array 110a and the second micromechanical arm array 110b occurs. One of ordinary skill in the art would appreciate that movement in more directions can be achieved by combining multiple MEMS actuators that are capable of moving in different directions.

In one example, the main beam 304a is fixed with respect to the main body of the MEMS actuator 101, and the main beam 304b moves relative to the main body of the MEMS actuator. In another example, the main beam 304b is fixed with respect to the main body of the MEMS actuator 101, and the main beam 304a moves relative to the main body of the MEMS actuator. Either way, electrical signals are converted into mechanical signals, and the movement of the MEMS actuator 101 is controlled by the electrical signals.

It should be understood that the structures shown in FIG. 3 is simplified to illustrate the principle of operation of the example MEMS actuator 101. The MEMS actuator 101 can include other components as needed. One of ordinary skill in the art would recognize many variations, modifications, and alternatives.

Figure 4:
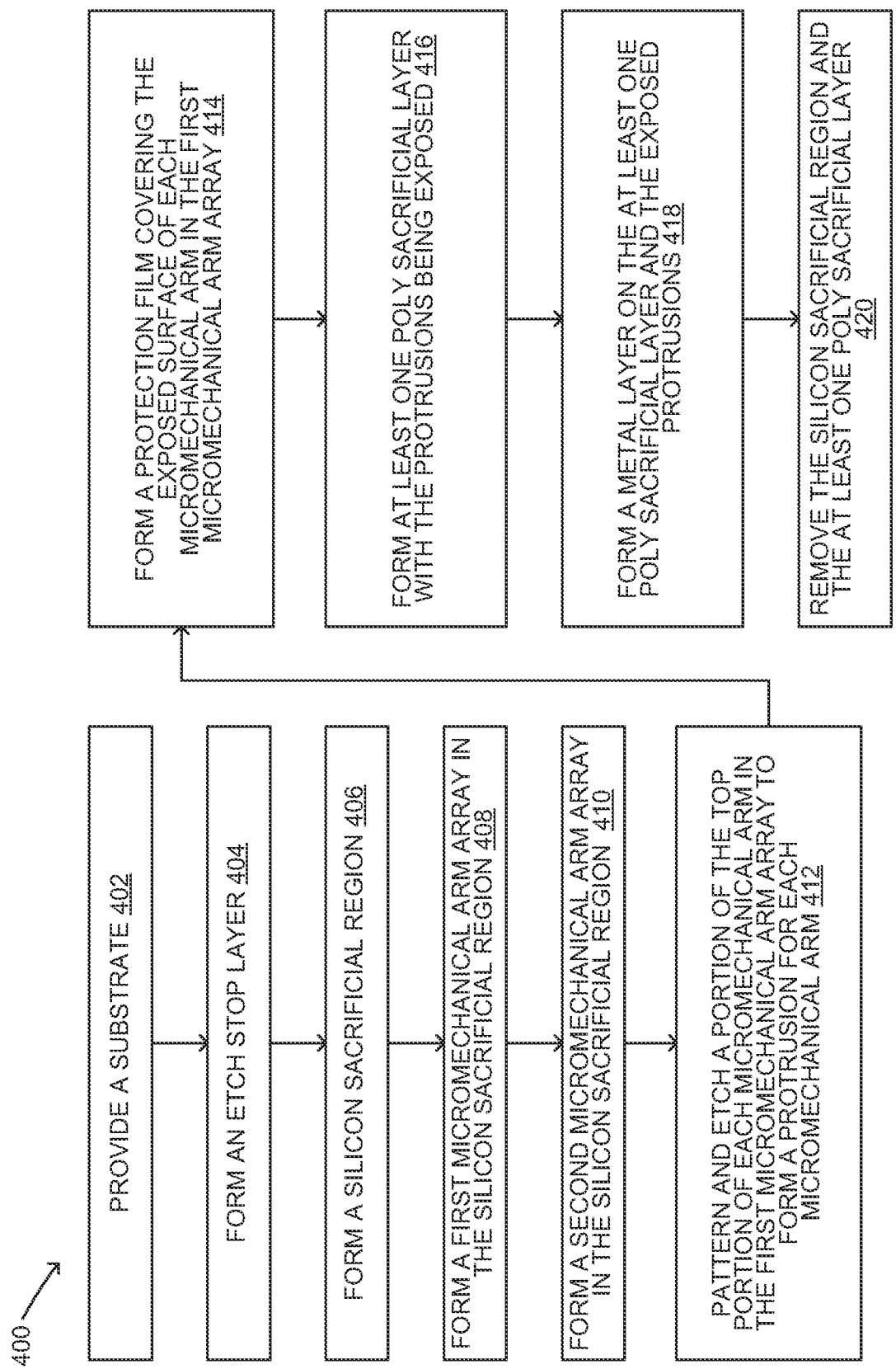
FIG. 4 is a flowchart diagram illustrating an example method for fabricating a MEMS actuator in accordance with some embodiments.

FIG. 4 is a flowchart diagram illustrating an example method for fabricating a MEMS actuator in accordance with some embodiments. In the example shown in FIG. 4, the method 400 includes operations 402, 404, 406, 408, 410, 412, 414, 416, 418, and 420. Additional operations may be performed. Also, it should be understood that the sequence of the various operations discussed above with reference to FIG. 4 is provided for illustrative purposes, and as such, other embodiments may utilize different sequences. These various sequences of operations are to be included within the scope of embodiments. FIGS. 5A-5G are cross-sectional views of a portion of the MEMS actuator at various stages of fabrication in accordance with some embodiments.

The method 400 starts at operation 402. At operation 402, a substrate is provided. In one implementation, the substrate is made of silicon. It should be understood that this implementation is not intended to be limiting.

At operation 404, an etch stop layer is formed. In one implementation, the etch stop layer is made of silicon dioxide. In other implementations, the etch stop layer is made of other materials that prevent the substrate from being etched by the etchant that is used during the subsequent silicon release process. In other words, the etchant selectively etches the sacrificial material but the etch stop layer. Some examples of materials used for the etch stop layer include silicon nitride ($Si_3N_4$), silicon oxynitride ($SiO_xN_y$), silicon carbide (SiC), silicon oxycarbide, silicon carbon nitride, other dielectrics, combinations thereof, or the like.

In one implementation, the etch stop layer is formed at the bottom and sidewalls of a trench that is formed in the substrate, as shown in FIG. 1. The etch stop layer may be formed by various deposition techniques such as plasma enhanced chemical vapor deposition (PECVD), low pressure CVD (LPCVD), or physical vapor deposition (PVD), or the like. It should be understood that the examples above are not intended to be limiting.

At operation 406, a silicon sacrificial region is formed. In one embodiment, the silicon sacrificial region is formed in the trench formed previously and separated from the substrate by the etch stop layer formed at operation 406. As such, when the silicon sacrificial region is subsequently removed during the silicon release process, the etch stop layer protects the substrate. In one implementation, the silicon sacrificial region is made of silicon.

At operation 408, a first micromechanical arm array is formed in the silicon sacrificial region. In one implementation, the first micromechanical arm array is formed using the following steps: patterning and etching certain regions of the silicon sacrificial region to form a number of trenches corresponding to the micromechanical arms of the first micromechanical arm array; forming a protection film at the bottom and sidewalls of the trenches; and forming a poly layer in the trenches corresponding to the micromechanical arms. One of ordinary skill in the art would appreciate that additional steps may be performed. For example, a planarization process such as chemical mechanical polishing (CMP) may be performed, and the protection film may be formed at the top surface of the poly layer such that the poly layer is covered or encapsulated by the protection film.

At operation 410, a second micromechanical arm array is formed in the silicon sacrificial region. In one implementation, the second micromechanical arm array is formed using the following steps: patterning and etching certain regions of the silicon sacrificial region to form a number of trenches corresponding to the micromechanical arms of the second micromechanical arm array; forming a protection film at the bottom and sidewalls of the trenches; and forming a poly layer in the trenches corresponding to the micromechanical arms. One of ordinary skill in the art would appreciate that additional steps may be performed. For example, the altitude (in the Z-direction) of the top surface of the silicon sacrificial layer in the area other than the first micromechanical arm array can be lowered by etching the silicon sacrificial layer with the first micromechanical arm array being covered by a photoresist pattern. In addition, a planarization process such as chemical mechanical polishing (CMP) may be performed, and the protection film may be formed at the top surface of the poly layer such that the poly layer is covered or encapsulated by the protection film.

In the example shown in FIG. 5A, which illustrates the region 190 shown in FIG. 1 after operation 410, the micromechanical arm 112a and the micromechanical arm 112b are formed in the silicon sacrificial region 502 (only the portion between the micromechanical arm 112a and the micromechanical arm 112b is shown). The micromechanical arm 112a is a part of the first micromechanical arm array 110a shown in FIG. 1, whereas the micromechanical arm 112b is a part of the second micromechanical arm array 110b shown in FIG. 1. The micromechanical arm 112a and the micromechanical arm 112b are both covered by the protection film 118. In the example shown in FIG. 5A, the top surface 206 of the original micromechanical arm 112a (before being etched to form the protrusion) is at a higher altitude in the Z direction than the top surface 204 of the micromechanical arm 112b.

Figure 5B:
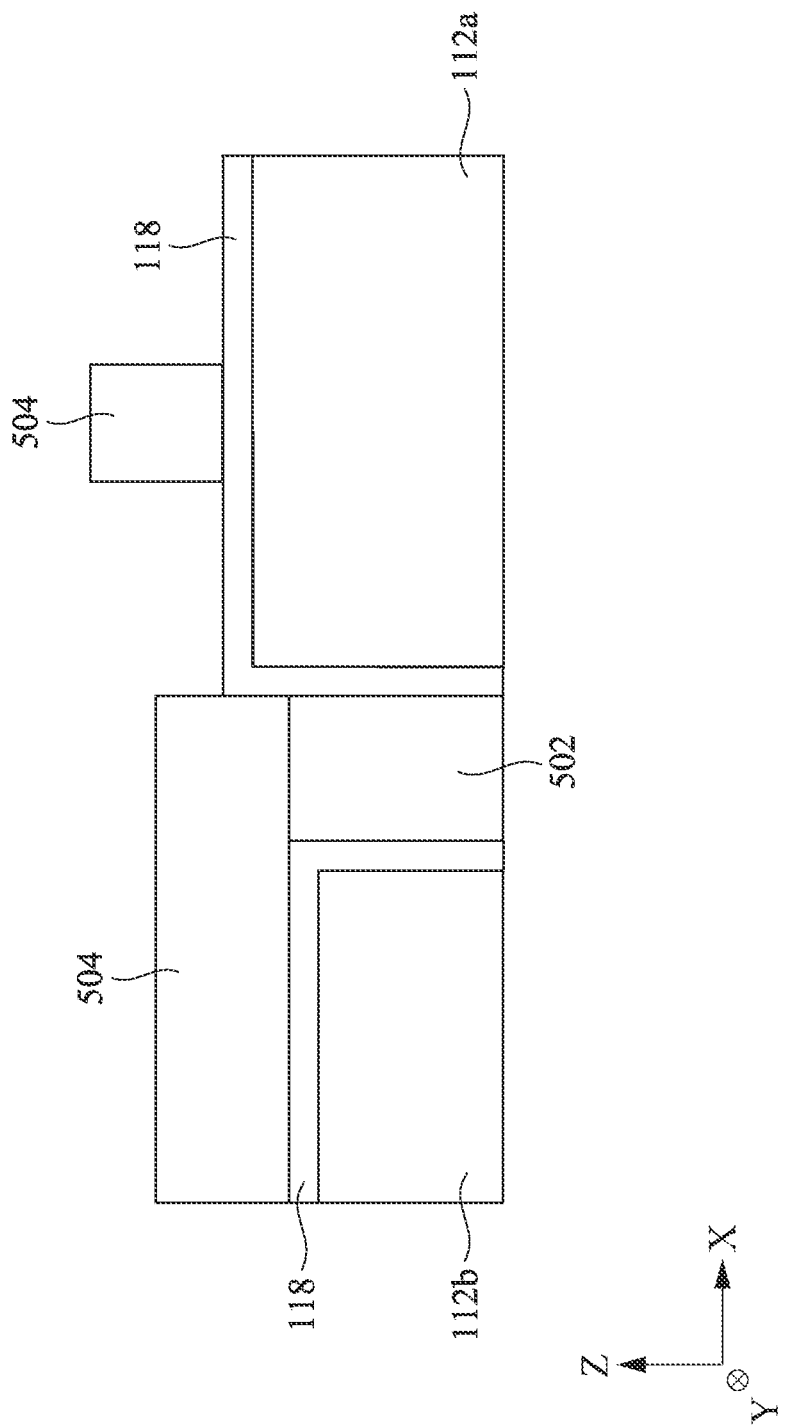

At operation 412, a portion of the top portion of each micromechanical arm in the first micromechanical arm array is patterned and etched to form a protrusion for each micromechanical arm. In one implementation, a photoresist pattern is formed, which covers everywhere except for the portion of the micromechanical arm to be etched. As shown in FIG. 5B, a photoresist pattern 504 covers the structure except for two top corners of the micromechanical arm 112a.

Figure 5C:
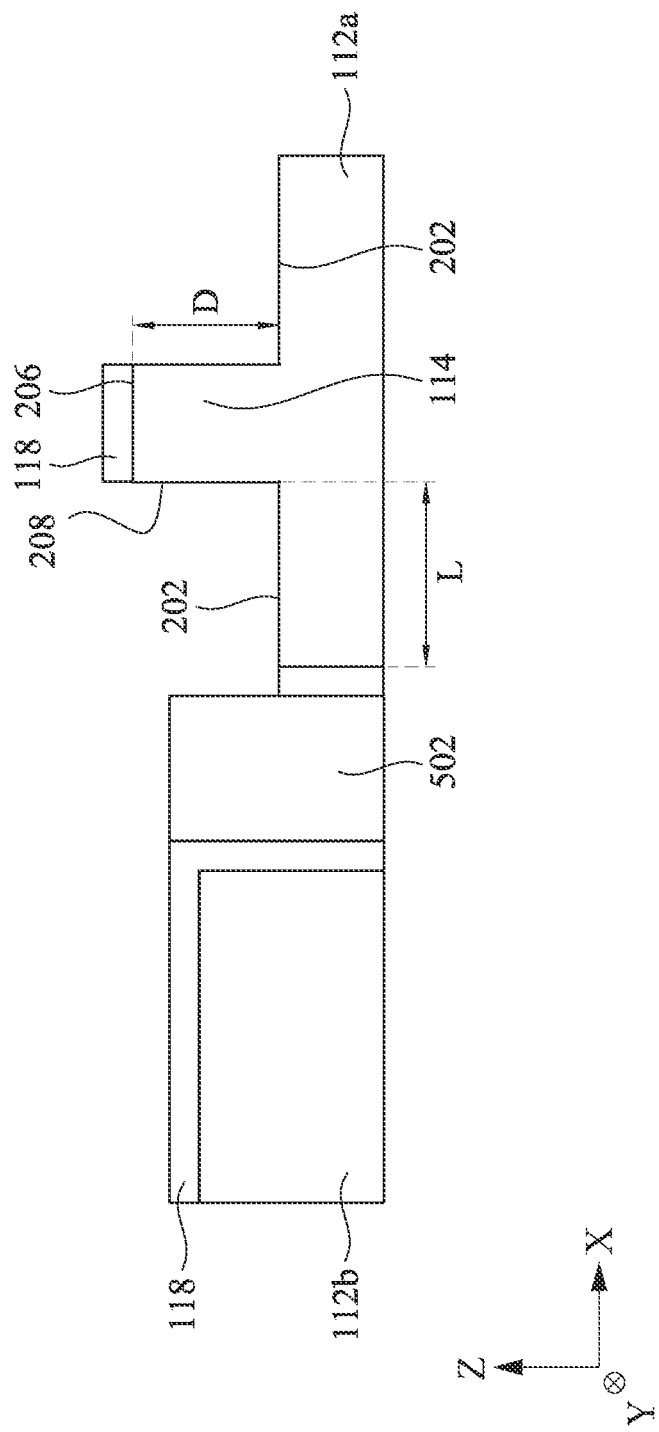

In the implementation, the exposed area of the structure is etched, and the photoresist pattern is removed. As shown in FIG. 5C, the protrusion 114 has a top surface 206 and two sidewalls 208, and two shoulders 202 are formed at both sides of the protrusion 114 in the X-direction. The depth of the etching in the Z-direction is D. The width of the shoulders 202 in the X-direction is L.

Figure 5D:
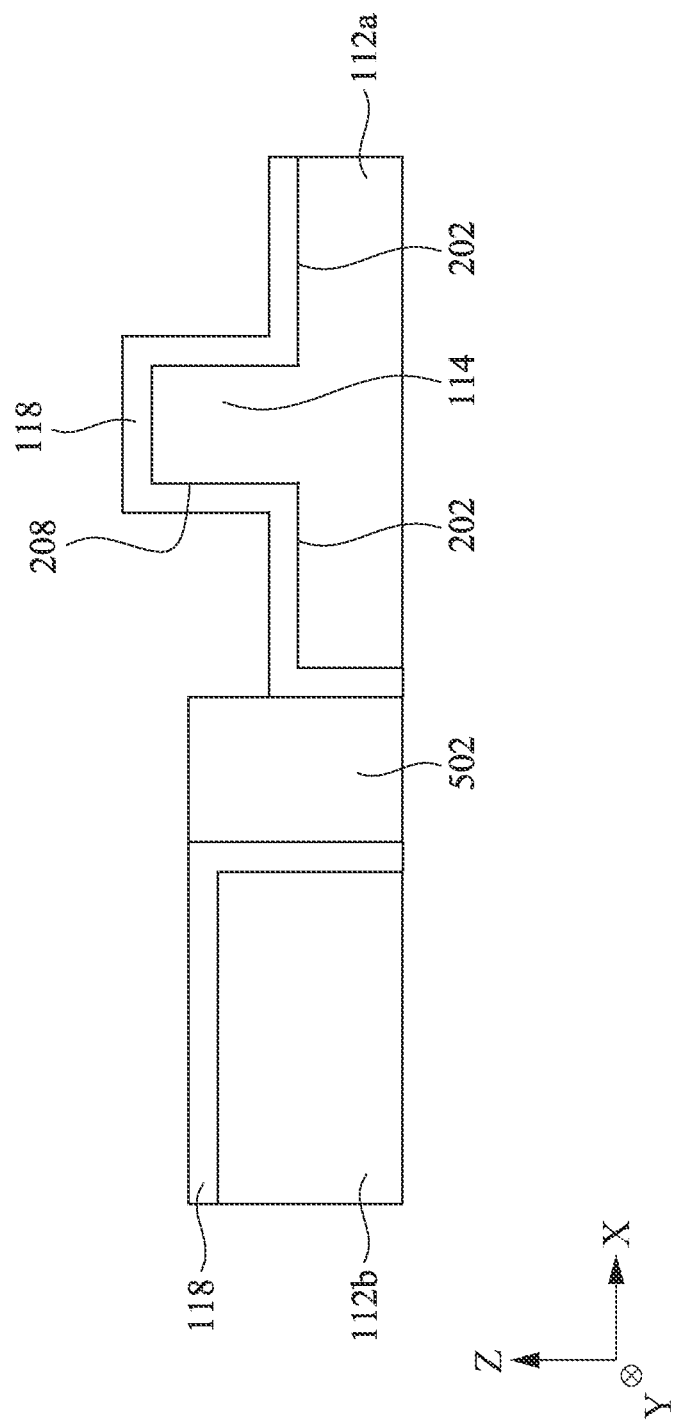

At operation 414, a protection film is formed, which covers the exposed surface of each micromechanical arm in the first micromechanical arm array. In one implementation, a photoresist pattern is formed to cover the structure except for the exposed area at operation 412. In other words, the same mask can be used at operation 410 and operation 412. In the implementation, a protection film is formed at the exposed area. As shown in FIG. 5D, the protection film 118 is formed at the sidewalls 208 of the protrusion and on the shoulders 202. As such, the entire micromechanical arm 112a is covered or encapsulated by the protection film 118 and protected during the subsequent silicon release process.

At operation 416, at least one poly sacrificial layer is formed on the structure, and the protrusions are exposed. In one implementation, a photoresist pattern is first formed on the protrusions 114, and at least one poly sacrificial layer is formed. In one embodiment, one poly sacrificial layer is formed. In another embodiment, two poly sacrificial layers are formed. In yet another embodiment, three or more poly sacrificial layers are formed. The at least one poly sacrificial layer is subsequently removed in the silicon release process. The at least one poly sacrificial layer may be formed by techniques such as CVD, LPCVD, PVD, plating, or the like.

Figure 5E:
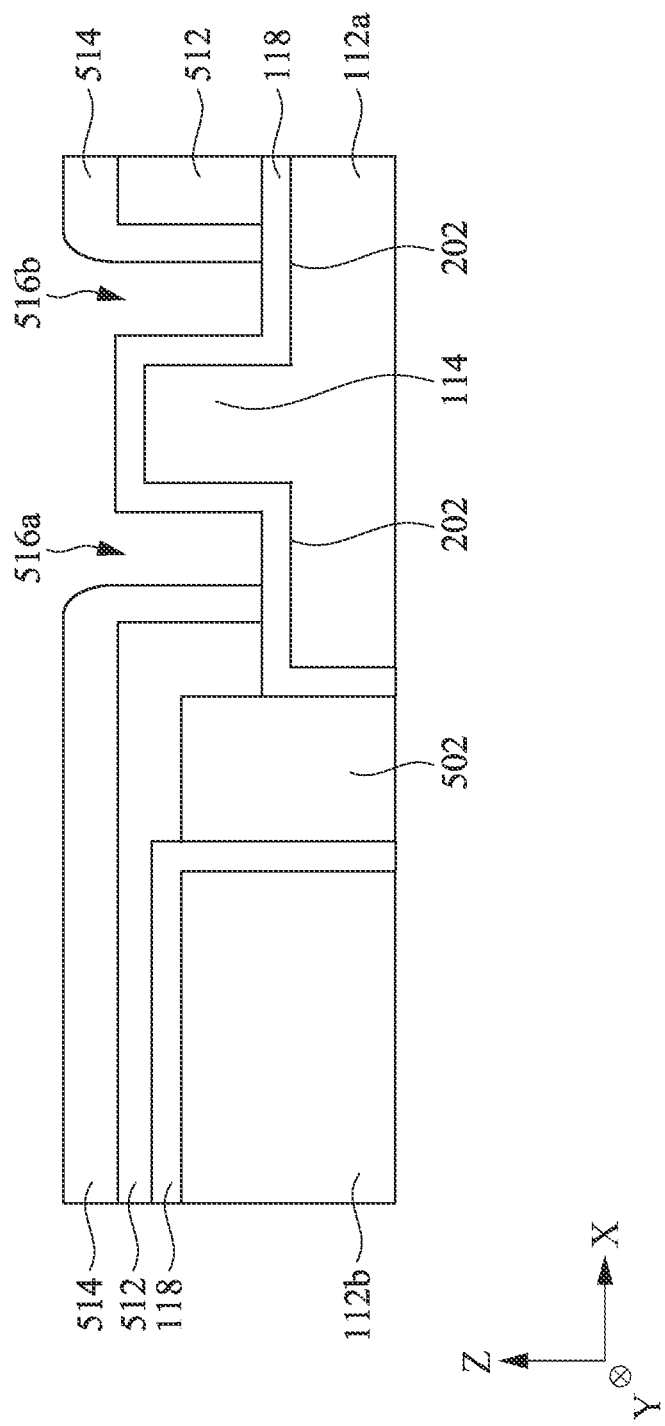

As shown in FIG. 5E, two poly sacrificial layers 512 and 514 are formed on the structure except for the protrusion 114. The poly sacrificial layers 512 and 514 are formed on the micromechanical arm 112b (with the protection film therebetween), the silicon sacrificial region 502 between the micromechanical arm 112a and the micromechanical arm 112b, and a portion of the shoulders 202 (with the protection film therebetween). Two gaps 516a and 516b are at both sides, in the X-direction, of the protrusion 114.

At operation 418, a metal layer is formed on the at least one poly sacrificial layer and the exposed protrusions. After operation 418, the metal connection structure like the metal connection structure 116 shown in FIG. 2 is formed. The metal layer fills the gaps at both sides of the protrusion, thus forming the joint portion 116a of the metal connection structure 116 as shown in FIG. 2. In some implementations, the metal layer is formed using metal plating techniques such as electroplating (sometimes referred to as electroplating deposition (ECD)). In one embodiment, the metal layer is made of aluminum-copper alloy (AlCu). In other embodiments, the metal layer may be made of materials such as titanium nitride (TiN), tantalum nitride (TaN), Al—Si—Cu alloy, copper (Cu), or other suitable materials. It should be understood that these examples are not intended to be limiting.

Figure 5F:
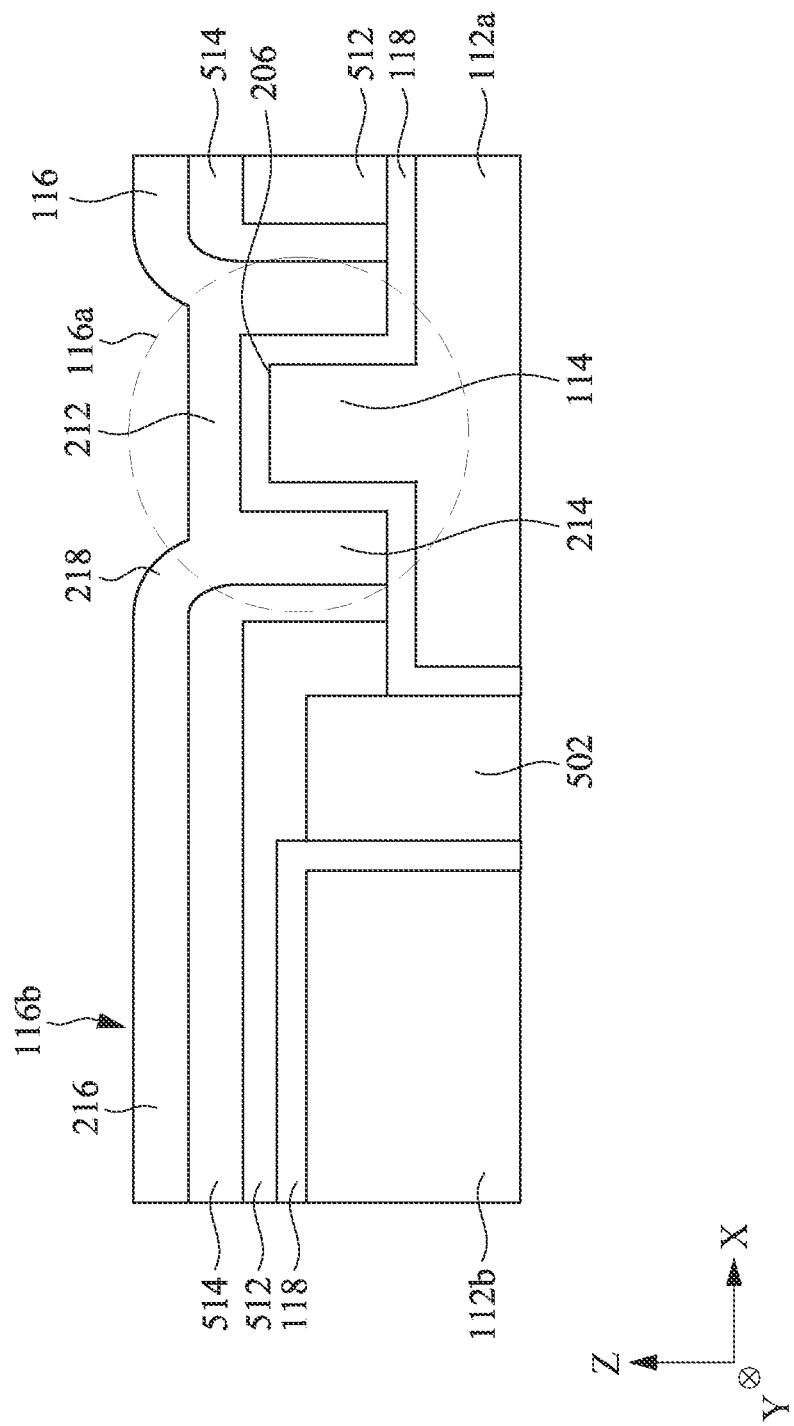

As shown in FIG. 5F, the metal connection structure 116 includes the joint portion 116a and the connection portion 116b. The joint portion 116a includes the top portion 212 and two sidewall portions 214. The top portion 212 is located on the top surface 206 of the protrusion 114, with the protection film 118 therebetween. The sidewall portions 214 are located at the sidewalls of the protrusion 114, with the protection film 118 therebetween. The connection portion 116b includes the planar portion 216 extending in the X-direction and round corner portion 218 at one end of the planar portion 216.

At operation 420, the silicon sacrificial region and the at least one poly sacrificial layer are removed. In one implementation, the silicon sacrificial region and the at least one poly sacrificial layer are removed using the silicon release process. As explained above, the silicon sacrificial region and the at least one poly sacrificial layer are made of materials that are selectively removable in the silicon release process. In the meantime, the etch stop layer (like the etch stop layer 104 shown in FIG. 1) and the protection film 118 are resistant to the etchant used in the silicon release process. Therefore, after the silicon sacrificial region and the at least one poly sacrificial layer are removed, a cavity (like the cavity 106 shown in FIG. 1) and the MEMS actuator (like the MEMS actuator 101 shown in FIG. 1) are suspended in the cavity are created.

The silicon release process is a process where a structure is formed on the sacrificial layer that is later removed to leave a gap between the structure and the etch stop layer under the sacrificial layer. In one example, the sacrificial layer is made of poly, and the etch stop layer is made of silicon nitride ($Si_3N_4$). The sacrificial layer, which is made of poly, is later etched using, for example, plasma etching. Sulfur hexafluoride ($SF_6$), for example, can be used as the etchant. During the plasma etching, a fraction of the sulfur hexafluoride breaks down into sulfur and fluorine, with the fluorine ions performing a chemical reaction with the sacrificial layer, which is made of polysilicon. It should be understood that the examples above are not intended to be limiting, and other materials, etchants, etching processes can be employed as needed.

In some implementations, a release aperture is fabricated using, for example, various lithography and etch techniques. The release aperture then provides access to the sacrificial layer for the etchant used in the sacrificial release process. The etchant starts etching through the release aperture and etches its way into the cavity. The size of the release aperture, along with other parameters such as the temperature, determines the etch rate of the sacrificial layer and can be designed accordingly. It should be understood that the above examples are not intended to be limiting. In some implementations, multiple release apertures can be used.

Figure 5G:
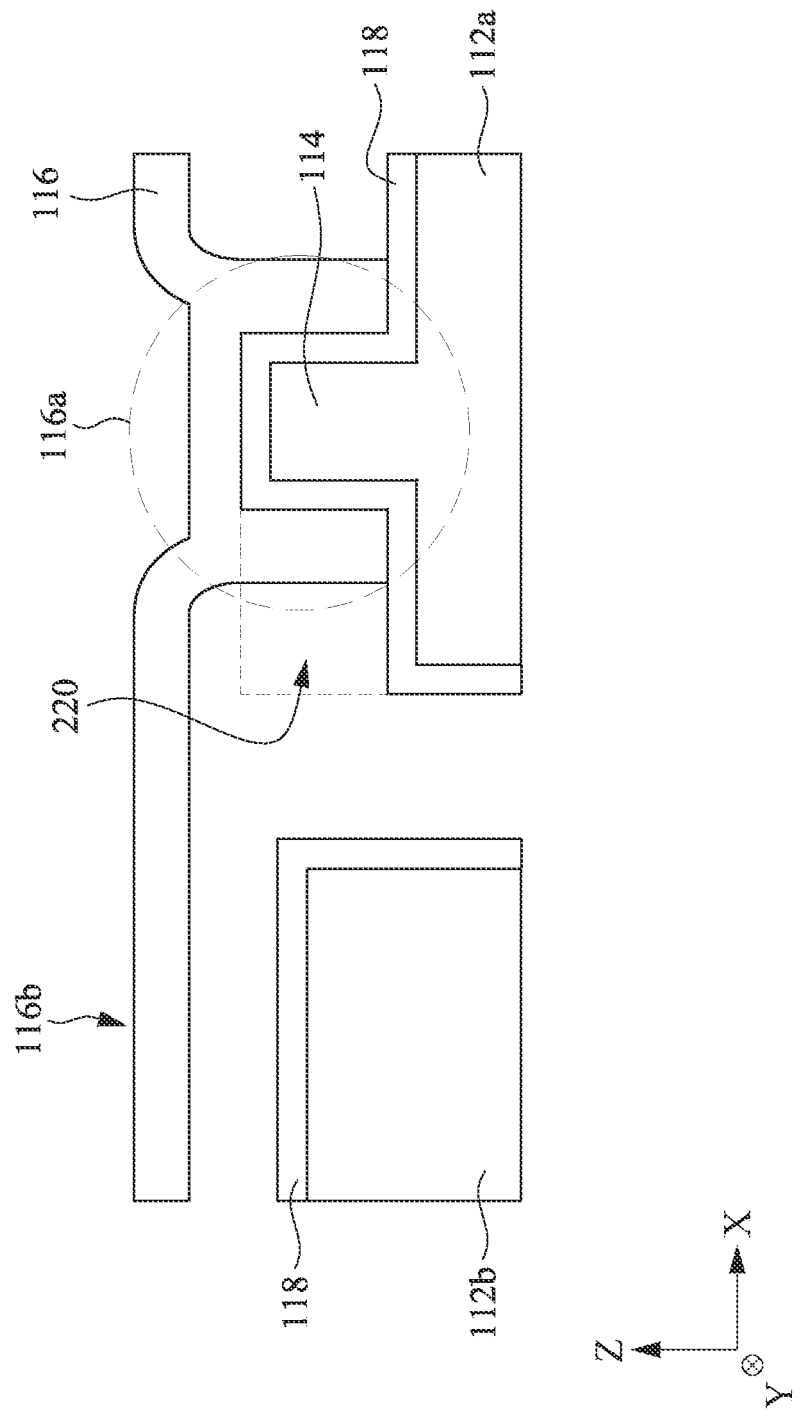

As shown in FIG. 5G, after operation 420, the micromechanical arm 112a is separated from the micromechanical arm 112b without the silicon sacrificial region 502 surrounding them. The additional space 220 is created to accommodate the movement of the micromechanical arm 112b relative to the micromechanical arm 112a.

Figure 6A:
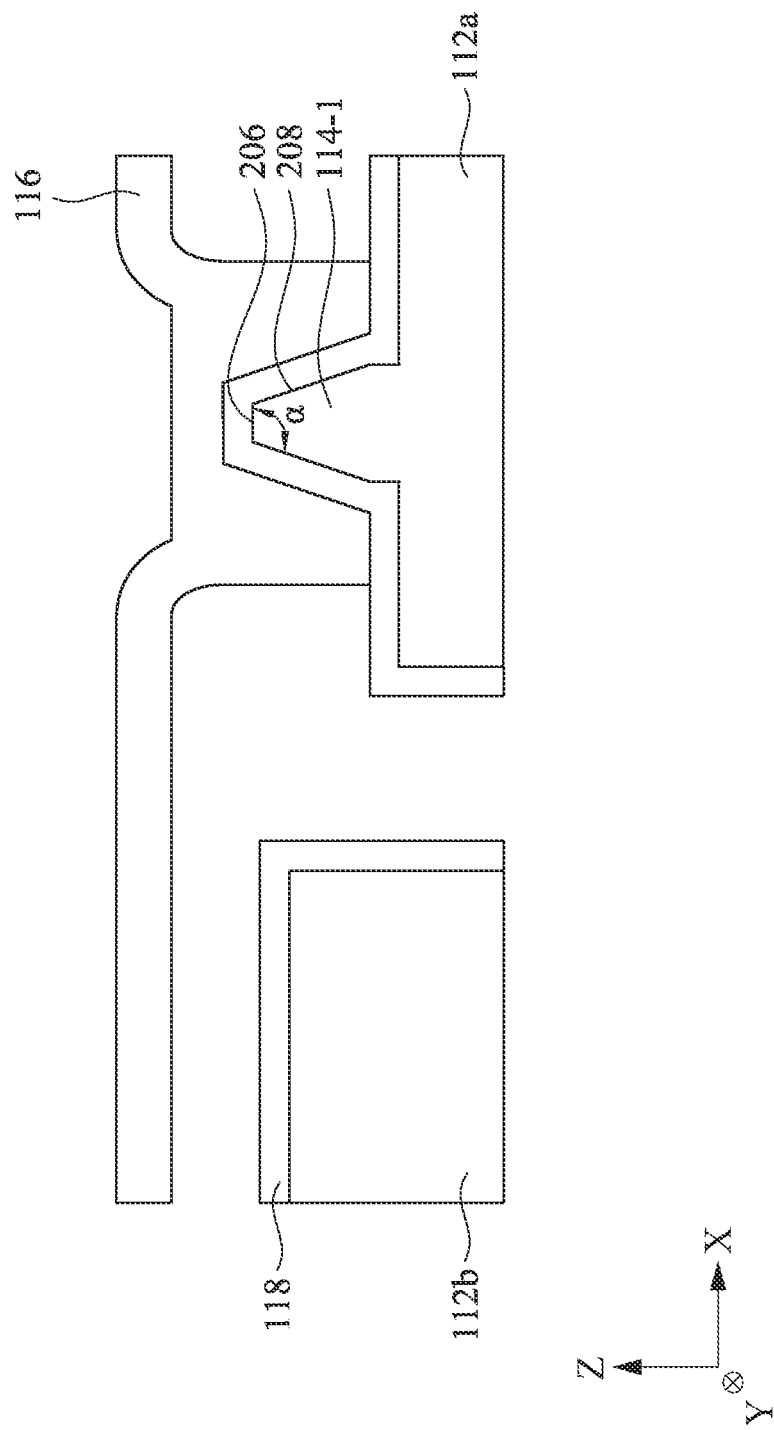
FIG. 6A is a diagram illustrating a portion of a MEMS actuator in accordance with some embodiments.
Figure 6B:
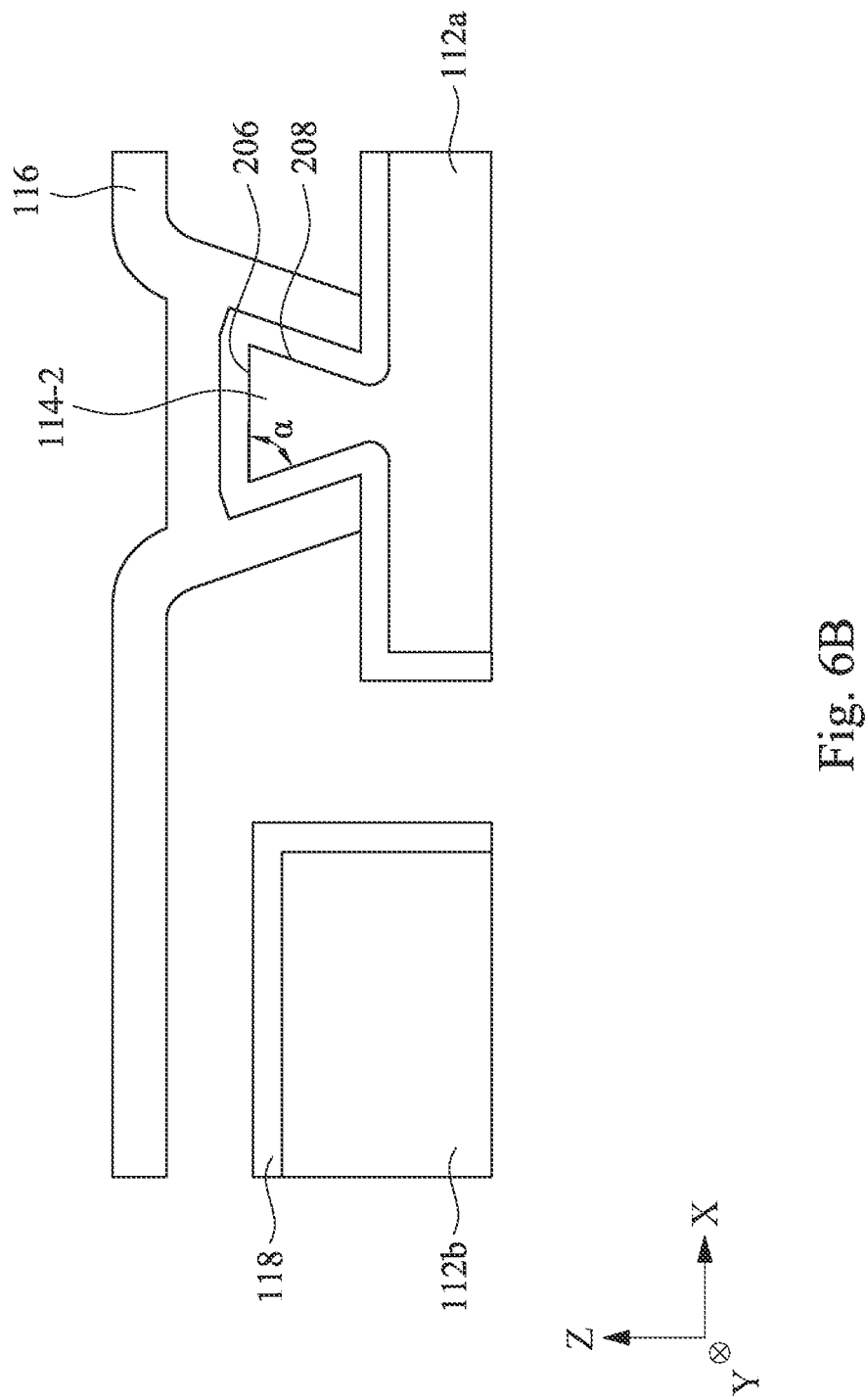
FIG. 6B is a diagram illustrating a portion of a MEMS actuator in accordance with some embodiments.
Figure 6C:
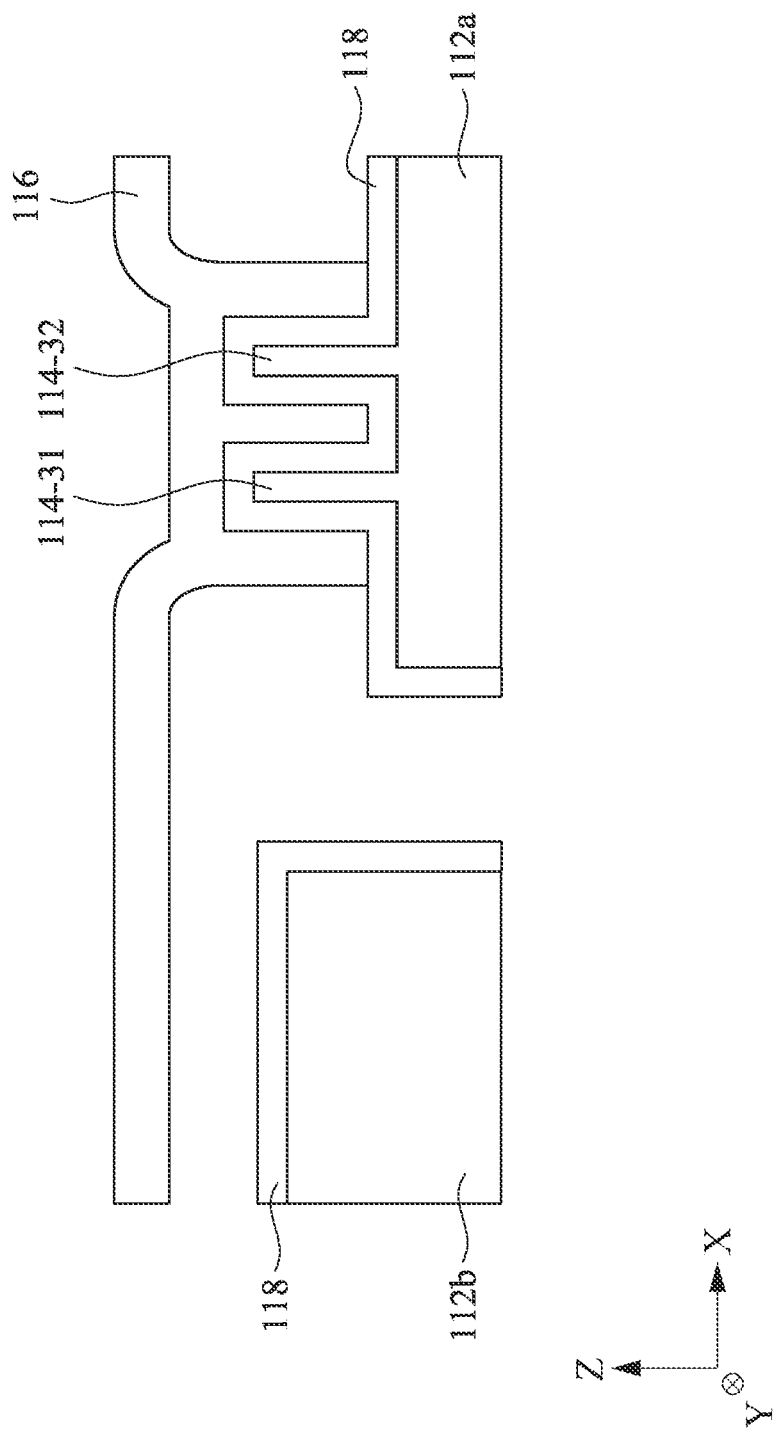
FIG. 6C is a diagram illustrating a portion of a MEMS actuator in accordance with some embodiments.

FIG. 6A is a diagram illustrating a portion of a MEMS actuator in accordance with some embodiments. FIG. 6B is a diagram illustrating a portion of a MEMS actuator in accordance with some embodiments. FIG. 6C is a diagram illustrating a portion of a MEMS actuator in accordance with some embodiments.

Different from the region 190 of the MEMS actuator 101 shown in FIG. 1, the protrusion 114-1 shown in FIG. 6A has a trapezoid cross-section in the X-Z plane. As shown in FIG. 6A, the sidewalls 208 of the protrusion 114-1 are inclined, characterized by an angle $\alpha$ shown in FIG. 6A. In other words, the top surface 206 and each sidewall 208 define the angle $\alpha$. Different from the region 190 of the MEMS actuator 101 shown in FIG. 1 where the angle $\alpha$ is 90 degrees, the angle $\alpha$ in the embodiment shown in FIG. 6A is larger than 90 degrees. In one example, the angle $\alpha$ is equal to 100 degrees. In another example, the angle $\alpha$ is equal to 110 degrees. In yet another example, the angle $\alpha$ is equal to 120 degrees. In still another example, the angle $\alpha$ is equal to 150 degrees.

Similarly, the protrusion 114-2 shown in FIG. 6B has a trapezoid cross-section in the X-Z plane. The sidewalls 208 of the protrusion 114-2 are inclined, characterized by an angle $\alpha$ shown in FIG. 6B. In other words, the top surface 206 and each sidewall 208 define the angle $\alpha$. The angle $\alpha$ in the embodiment shown in FIG. 6B is smaller than 90 degrees. In one example, the angle $\alpha$ is equal to 80 degrees. In another example, the angle $\alpha$ is equal to 70 degrees. In yet another example, the angle $\alpha$ is equal to 60 degrees. In still another example, the angle $\alpha$ is equal to 45 degrees.

Different from the region 190 of the MEMS actuator 101 shown in FIG. 1 where the micromechanical arm 112a has one protrusion 114, the micromechanical arm 112a shown in FIG. 6C has two protrusions 114-31 and 114-32. The increased number of protrusions increases the contact area between the metal connection structure 116 and the micromechanical arm 112a (with the protection film 118 therebetween). The increased contact area results in a better conductivity of the micromechanical arm 112a. It should be understood that more than two protrusions can be employed in other embodiments.

Figure 7:
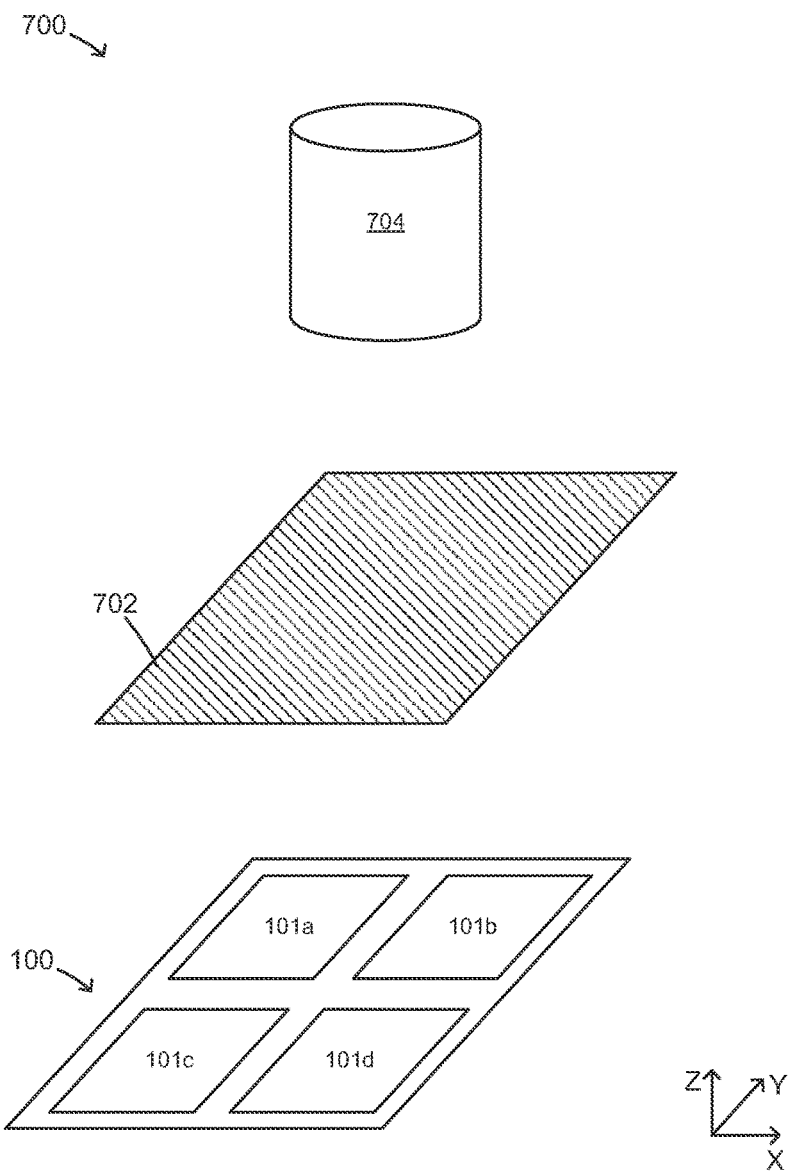
FIG. 7 is a diagram illustrating a sensor-shift optical image stabilization (OIS) system in accordance with some embodiments.

FIG. 7 is a diagram illustrating a sensor-shift OIS system 700 in accordance with some embodiments. The sensor-shift OIS system 700 includes, among other components, the MEMS system 100 like the one shown in FIG. 1, an image sensor 702, and a lens 704.

The image sensor 702 is attached to the MEMS system 100 and is operable to detect and convey information used to make an image. The image sensor 702 converts the variable attenuation of light waves coming through the lens 704 into signals. In one implementation, the image sensor 702 is a charge-coupled device (CCD). In another implementation, the image sensor 702 is a CMOS image sensor (CIS). A CMOS image sensor typically includes a microlens that gathers light, color filters that separate out the red, green, and blue (i.e., "RGB") components, and a photodiode that captures the filtered light. In some examples, the CMOS image sensor is a front-side illumination (FSI) CMOS image sensor. In another example, the CMOS image sensor is a backside illumination (BSI) CMOS image sensor.

As explained above, the MEMS system 100 includes, for example, four MEMS actuators 101a, 101b, 101c, and 101d, each of which may move in one direction, and the movement is controlled by electrical signals. As a result, the image sensor 702 attached to the MEMS system 100 can be moved accordingly under the control of electrical signals, thus achieving sensor-shift OIS.

In accordance with some aspects of the disclosure, a micromechanical arm array is provided. The micromechanical arm array comprises: a plurality of micromechanical arms spaced from each other in a first horizontal direction and extending in a second horizontal direction, wherein each micromechanical arm comprises a protrusion at a top of each micromechanical arm and protruding upwardly in a vertical direction; a plurality of protection films, each protection film encapsulating one of the plurality of micromechanical arms; and a metal connection structure extending in the first horizontal direction. The metal connection structure comprises: a plurality of joint portions, each joint portion corresponding to and surrounding the protrusion of one of the plurality of micromechanical arms; and a plurality of connection portions extending in the first horizontal direction and connecting two neighboring joint portions.

In accordance with some aspects of the disclosure, a micro-electromechanical systems (MEMS) actuator is provided. The MEMS actuator comprises: a first micromechanical arm array and a second micromechanical arm array. The first micromechanical arm array comprises: a plurality of first micromechanical arms spaced from each other in a first horizontal direction and extending in a second horizontal direction, wherein each first micromechanical arm comprises a protrusion at a top of each first micromechanical arm and protruding upwardly in a vertical direction; a plurality of first protection films, each first protection film encapsulating one of the plurality of first micromechanical arms; and a metal connection structure extending in the first horizontal direction and comprising: a plurality of joint portions, each joint portion corresponding to and surrounding the protrusion of one of the plurality of first micromechanical arms; and a plurality of connection portions extending in the first horizontal direction and connecting two neighboring joint portions. The second micromechanical arm array comprises: a plurality of second micromechanical arms spaced from each other in the first horizontal direction and extending in the second horizontal direction, wherein each second micromechanical arm is characterized by a flat top surface, and is located between two neighboring first micromechanical arms in the first horizontal direction; and a plurality of second protection films, each second protection film encapsulating one of the plurality of second micromechanical arms.

In accordance with some aspects of the disclosure, a method for fabricating a micro-electromechanical systems (MEMS) actuator is provided. The method comprises the following steps: providing a silicon sacrificial region in a substrate; forming a first micromechanical arm array in the silicon sacrificial region, the first micromechanical arm array comprising a plurality of first micromechanical arms spaced from each other in a first horizontal direction and extending in a second horizontal direction; forming a second micromechanical arm array in the silicon sacrificial region, the second micromechanical arm array comprising a plurality of second micromechanical arms spaced from each other in the first horizontal direction and extending in the second horizontal direction, wherein each second micromechanical arm is characterized by a flat top surface and is located between two neighboring first micromechanical arms in the first horizontal direction; etching a portion of each first micromechanical arm to form a protrusion at a top of each first micromechanical arm, wherein the protrusion protrudes upwardly in a vertical direction; forming at least one polycrystalline silicon sacrificial layer on a portion of the silicon sacrificial region, a portion of the first micromechanical arm array, and a portion of the second micromechanical arm array, wherein the protrusion of each first micromechanical arm is exposed; forming a metal layer on the at least one polycrystalline silicon sacrificial layer and the protrusions of the plurality of first micromechanical arms; and removing the silicon sacrificial region and the at least one polycrystalline silicon sacrificial layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A micromechanical arm array comprising:
a plurality of micromechanical arms spaced from each other in a first horizontal direction and extending in a second horizontal direction, wherein each of the plurality of micromechanical arms comprises a protrusion at a top of each of the plurality of micromechanical arms and protruding upwardly in a vertical direction; and
a metal connection structure extending in the first horizontal direction and comprising:
a plurality of joint portions, each joint portion corresponding to and surrounding the protrusion of one of the plurality of micromechanical arms; and
a plurality of connection portions extending in the first horizontal direction and connecting two neighboring joint portions.

2. The micromechanical arm array of claim 1, wherein the protrusion comprises a top surface and two sidewalls.

3. The micromechanical arm array of claim 2, wherein the protrusion extends in the second horizontal direction.

4. The micromechanical arm array of claim 2, wherein the protrusion extends in the second horizontal direction and has a trapezoid cross-section.

5. The micromechanical arm array of claim 2, wherein the top surface and each of the two sidewalls define an angle, and the angle is larger than 90 degrees.

6. The micromechanical arm array of claim 2, wherein the top surface and each of the two sidewalls define an angle, and the angle is smaller than 90 degrees.

7. The micromechanical arm array of claim 1, wherein the joint portion and the protrusion sandwich a portion of a protection film.

8. The micromechanical arm array of claim 7, wherein the protection film encapsulates one of the plurality of micromechanical arms.

9. The micromechanical arm array of claim 7, wherein the joint portion comprises a top and two sidewall portions.

10. The micromechanical arm array of claim 1, wherein the connection portion comprises a planar portion extending in the first horizontal direction and two round corner portions at both ends of the planar portion.

11. A micro-electromechanical systems (MEMS) actuator comprising:
a first micromechanical arm array comprising:
a plurality of first micromechanical arms spaced from each other in a first horizontal direction and extending in a second horizontal direction, wherein each first micromechanical arm comprises a protrusion at a top of each first micromechanical arm and protruding upwardly in a vertical direction; and
a metal connection structure extending in the first horizontal direction and comprising:
a plurality of joint portions, each joint portion corresponding to and surrounding the protrusion of one of the plurality of first micromechanical arms; and
a plurality of connection portions extending in the first horizontal direction and connecting two neighboring joint portions; and
a second micromechanical arm array comprising:
a plurality of second micromechanical arms spaced from each other in the first horizontal direction and extending in the second horizontal direction, wherein each second micromechanical arm is characterized by a flat top surface, and is located between two neighboring first micromechanical arms in the first horizontal direction.

12. The MEMS actuator of claim 11, wherein the joint portion and the protrusion sandwich a portion of a first protection film, and the protection film encapsulates one of the plurality of first micromechanical arms.

13. The MEMS actuator of claim 11, wherein the first micromechanical arm array further comprises a first spine beam extending in the first horizontal direction and connecting the plurality of first micromechanical arms, and wherein the second micromechanical arm array further comprises a second spine beam extending in the first horizontal direction and connecting the plurality of second micromechanical arms.

14. A micromechanical arm array comprising:
a plurality of micromechanical arms spaced from each other in a first horizontal direction and extending in a second horizontal direction, wherein each micromechanical arm has a nonplanar top surface;
a plurality of protection films, each protection film encapsulating one of the plurality of micromechanical arms; and
a metal connection structure extending in the first horizontal direction and comprising:
a plurality of joint portions, each joint portion corresponding to and coupled to the nonplanar top surface of one of the plurality of micromechanical arms; and
a plurality of connection portions extending in the first horizontal direction and connecting two neighboring joint portions.

15. The micromechanical arm array of claim 14, wherein the nonplanar top surface is characterized by a protrusion protruding upwardly in a vertical direction.

16. The micromechanical arm array of claim 15, wherein the protrusion comprises a top surface and two sidewalls.

17. The micromechanical arm array of claim 14, wherein the nonplanar top surface is characterized by a fin at the top of each of the plurality of micromechanical arms, and the fin is extending in the second horizontal direction.

18. The micromechanical arm array of claim 17, wherein two shoulders are located at two sides of the fin in the first horizontal direction, respectively.

19. The micromechanical arm array of claim 14, wherein the plurality of micromechanical arms are made of polycrystalline silicon.

20. The micromechanical arm array of claim 14, wherein the plurality of protection films are made of silicon dioxide.

* * * * *